(12) United States Patent  
Pärn

(10) Patent No.: US 6,583,973 B1
(45) Date of Patent: Jun. 24, 2003

(54) ELECTRICAL CONDITIONING MONITORING MODULE FOR A VEHICULAR ELECTRICAL SYSTEM

(75) Inventor: Juri Pärn, Göteborg (SE)

(73) Assignee: Volvo Car Corporation, Göteborg (SE)

( * ) Notice: Subject to any disclaimer, the term of this patent is extended or adjusted under 35 U.S.C. 154(b) by 0 days.

(21) Appl. No.: 09/560,924

(22) Filed: Apr. 30, 2000

Related U.S. Application Data

(60) Provisional application No. 60/131,934, filed on Apr. 30, 1999.

(51) Int. Cl.⁷ .................................................. H02H 3/00
(52) U.S. Cl. ........................... 361/88; 361/58; 361/93.1; 361/103
(58) Field of Search ........................ 361/115, 58, 93.1, 361/88, 18, 103

(56) References Cited

U.S. PATENT DOCUMENTS 5,235,317 A * 8/1993 Sutterlin et al. ........... 307/10.8

* cited by examiner

Primary Examiner—Stephen W. Jackson
(74) Attorney, Agent, or Firm—Howrey Simon Arnold & White LLP

(57) ABSTRACT

An interface device adapted to be connected between an electrical circuit and a monitor. The invention of a common terminal, "n" number of sensing terminals, "n" number of sensing impedances, and "n" number of load terminals. Each load terminal is in electrical communication with the common terminal through a separate sensing impedance. Each sensing impedance is substantially less than the aggregate electrical circuit load side impedance between the sensing impedance and ground when the invention is connected in series between the supply side and load side of the electrical circuit. Each load terminal is substantially the same electrical point as only one sensing terminal. In one embodiment, the invention incorporates various protective elements including: a supply side electrical circuit protective element; a load side electrical circuit protective element; and a monitor circuit protective element.

4 Claims, 4 Drawing Sheets

(1 of 4 Drawing Sheet(s) Filed in Color)

ELECTRICAL CONDITIONING MONITORING MODULE FOR A VEHICULAR ELECTRICAL SYSTEM

RELATED PATENT APPLICATIONS

This patent application claims priority to U.S. provisional application No. 60/131,934 filed Apr. 30, 1999 entitled ELECTRICAL CONDITIONING MONITORING MODULE FOR A VEHICULAR ELECTRICAL SYSTEM. Said application in its entirety is hereby expressly incorporated by reference into the present application pursuant to 37 CFR 1.53 (c).

DESCRIPTION

1. Technical Field

The present invention relates generally to a vehicular electrical systems.

2. Background Art

The use of a microelectronic-based monitor to detect fault conditions in a vehicle electrical circuit, such as a signal lamp circuit, is well known. In such an application, the monitor typically includes a very low impedance element inserted in series in the vehicle electrical circuit as a sensing element. The voltage across the sensing element is detected by the monitor microelectronics and then compared to a profile of voltage states to determine status of the vehicle electrical circuit, e.g., one of four lamps in a signal lamp circuit has burnt out. Response, such as notifying the vehicle operator or disconnecting the circuit, may then be initiated by the monitor based on the status of the signal lamp circuit. The impedance presented by the monitor microelectronics in parallel with the sensing element is typically much greater than the impedance of the sensing element.

The vehicle electrical circuit typically includes a protective element sized to open the circuit in the event of over-current. However, these protective elements are typically sized to protect the vehicle electrical circuit, not the monitor microelectronics. Fault conditions in the vehicle electrical circuit, such as an over-current brought on by a short circuit, could damage monitor microelectronics before the vehicle electrical circuit's protective element opens the circuit.

Typically, the sensing element is integrated into the monitor as one or more discrete electrical elements, e.g., resistor(s) soldered onto a printed circuit board in the monitor. In that case, should the sensing element be damaged by conditions in the vehicle electrical circuit, maintainability and cost considerations usually dictate removal and replacement of the entire monitor, as opposed to removal and replacement of the sensing element.

In view of the above described deficiencies associated with the use of known designs for automatic climate control systems, the present invention has been developed to alleviate these drawbacks and provide further benefits to the user. These enhancements and benefits are described in greater detail hereinbelow with respect to several alternative embodiments of the present invention.

SUMMARY OF THE INVENTION

The present invention is a modular interface device used in place of an integrated sensing element. The interface device contributes to increased vehicle maintainability by reducing mean time to repair and reducing the cost of replacing a failed integrated sensing element or monitor.

In one embodiment, the current invention is an interface device adapted to be connected between an electrical circuit and a monitor. The interface device consists of a common terminal, "n" number of sensing terminals, "n" number of sensing impedances, and "n" number of load terminals. Each load terminal is in electrical communication with the common terminal through a separate sensing impedance. Each sensing impedance is substantially less than the aggregate electrical circuit load side impedance between the sensing impedance and ground when the interface device is connected in series between the supply side and load side of the electrical circuit. Each load terminal is substantially the same electrical point as only one sensing terminal.

In a further embodiment, the interface device incorporates various protective elements including: a supply side electrical circuit protective element; a load side electrical circuit protective element; and a monitor circuit protective element.

In a further embodiment conductive elements of the interface device are formed as a continuous resistance-calibrated conductor fabricated from a single piece of electrically conductive material. In that embodiment the conductor is substantially enclosed in a non-conductive case exposing only the common terminal, each load terminal, and each sensing terminal. Additionally, each terminal is formed into substantially flat tabs adapted for concurrent releasable mechanical engagement in electrical communication with corresponding electrical circuit and monitor terminals.

In another embodiment, the invention is shown installed as an interface between a vehicle electrical circuit and a monitor at a terminal block. Several interface devices are shown interconnecting electrical circuits and corresponding monitors.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

MODE(S) FOR CARRYING OUT THE INVENTION

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a basis for the claims and as a representative basis for teaching one skilled in the art to variously employ the present invention.

Figure 1:
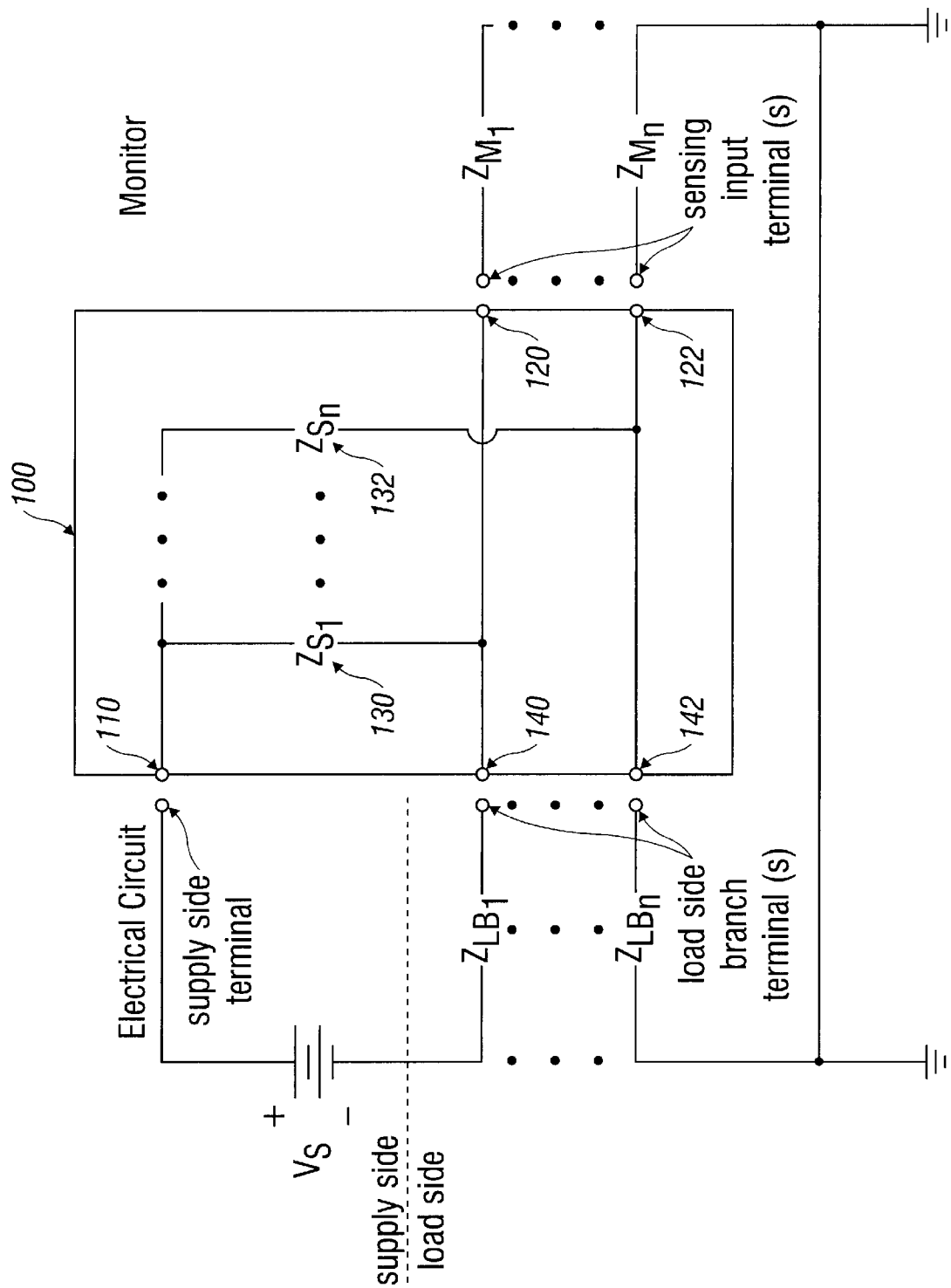
FIG. 1 is a schematic representation of a preferred embodiment of the present invention in relationship with both an electrical circuit having multiple load side branches and a corresponding monitor (represented as parallel impedances to ground).

Referring to FIG. 1, an interface device 100 for electrical communication between an electrical circuit and a monitor is shown.

In FIG. 1, the electrical circuit has: a grounded supply side, a power supply $V_s$, and a supply side terminal. In addition, the electrical circuit has a load side characterized by a load side impedance to ground, including "n" number of load side branches, each having a load side branch terminal and each characterized by a load side branch impedance $Z_{LBn}$ to ground.

Further in FIG. 1, a monitor is shown having "n" number of sensing input terminals. Each sensing input terminal is characterized by an impedance $Z_{Mn}$ between the sensing input terminal and ground substantially greater than any load side branch impedance $Z_{LBn}$ to ground.

The interface device 100 is adapted to be connected in series concurrently between: the supply side and the load side of the electrical circuit; and between the supply side of the electrical circuit and the monitor. As illustrated in FIG. 1, the interface device 100 consists of: a common terminal 110 adapted for connection in electrical communication with the supply side terminal of the electrical circuit; "n" number of sensing terminals 120, 122, "n" number of sensing impedances 130, 132, and "n" number of load terminals 140, 142.

Each sensing terminal 120, 122 is adapted for connection in electrical communication with one monitor sensing input terminal. Each sensing impedance $Z_{sn}$ 130, 132 is substantially less than the aggregate load side impedance between the sensing impedance 130, 132 and ground when the interface device 100 is connected in series between the supply side and load side of the electrical circuit.

Each load terminal 140, 142 is adapted for connection in electrical communication with at least one load side branch terminal of the electrical circuit. In the embodiment illustrated in FIG. 1, each load terminal 140, 142, is substantially the same electrical point as only one sensing terminal 120, 122. Further, each load terminal 140, 142, is in electrical communication with the common terminal 110 through a separate sensing impedance, 130, 132.

Figure 2:
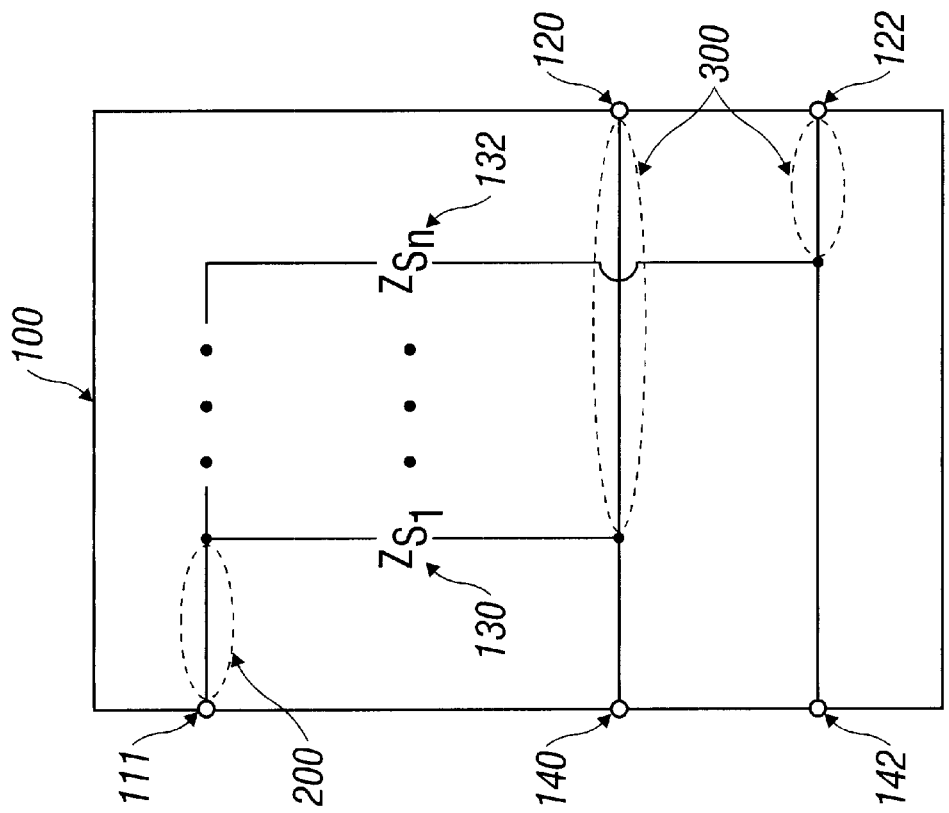
FIG. 2 is a schematic representation of a preferred embodiment of the present invention indicating where various circuit protective element may be included.

Referring to FIG. 2, a schematic representation of a preferred embodiment of the interface device 100, with "n" equal to 2, illustrating incorporation of protective devices 200, 300, 400 is shown. In the illustrated embodiment, a supply side electrical circuit protective element 200 is in electrical communication in series between the common terminal 111 and the aggregate sensing impedance of the interface device 100. Also illustrated in FIG. 2, a load side electrical circuit protective element 300 is in electrical communication in series between one said sensing impedance 130 and its corresponding load terminal 140. Finally, a monitor circuit protective element 400 is shown in FIG. 2 in electrical communication in series between a sensing impedance 132 and its corresponding sensing terminal 122, without being in series between the sensing impedance 132 and its corresponding load terminal 142.

Figure 3:
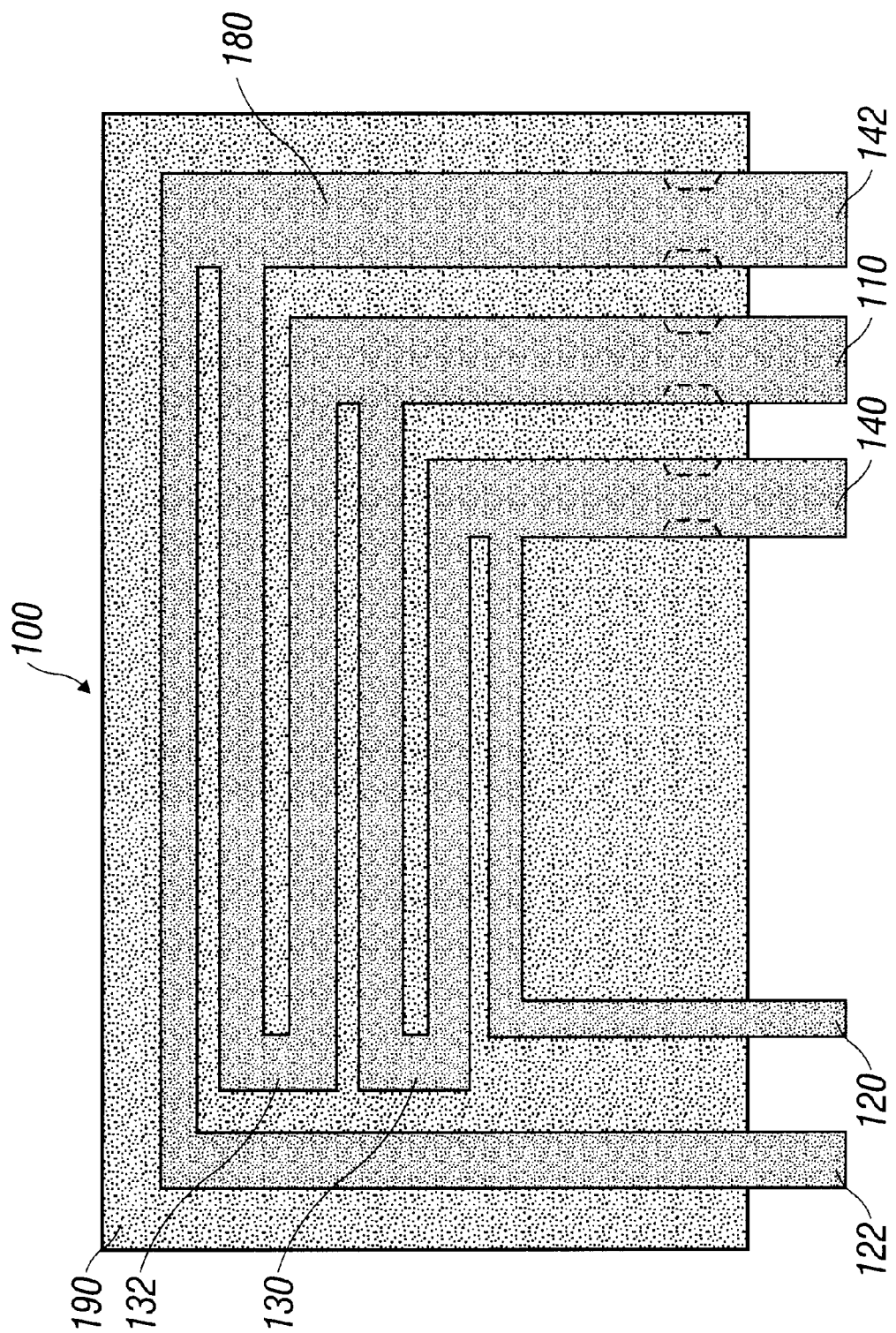
FIG. 3 is a cutaway view of a preferred embodiment of the present invention where conductive elements are formed as a continuous resistance-calibrated conductor formed from a piece of electrically conductive material and substantially enclosed in a non-conductive case, and exposing substantially flat tabs adapted for concurrent releasable mechanical engagement in electrical communication with corresponding electrical circuit terminal and monitor terminal receivers.

FIG. 3 illustrates a cutaway view of a preferred embodiment of the interface device 100 wherein conductive elements of the interface device 100 are formed as a continuous resistance-calibrated conductor 180 fabricated from a single piece of electrically conductive material. FIG. 3 illustrates an interface device adapted to operate with "n" equal to 2, i.e., the interface device 100 is adapted to be connected to an electrical circuit having two (2) electrical circuit load side branches and a monitor having two (2) monitor terminals.

The conductor 180 is substantially enclosed in a non-conductive case 190, except that the common terminal 110, each load terminal 140, 142, and each sensing terminal 120, 122 are exposed to allow electrical communication with corresponding terminals of an electrical circuit and a monitor.

Additionally, the common terminal 110, each sensing terminal 120, 122, and each load terminal 140, 142 are formed into substantially flat tabs and are adapted for concurrent releasable mechanical engagement in electrical communication with corresponding electrical circuit supply side terminals, monitor sensing terminals and electrical circuit load side terminals, respectively.

Figure 4:
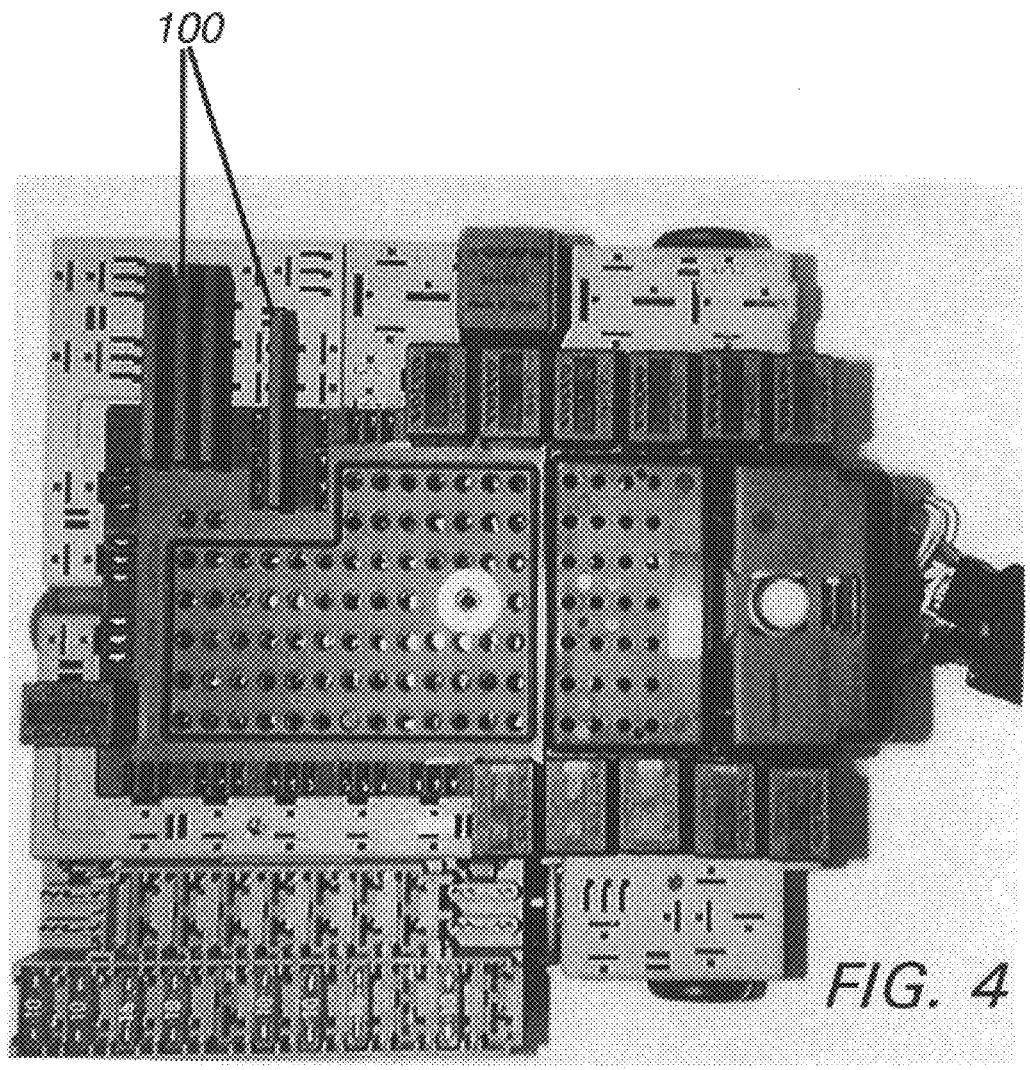
FIG. 4 is a color photographic illustration of the embodiment represented in FIG. 3 installed as an interface between a vehicle electrical circuit and a monitor.

FIG. 4 illustrates a preferred embodiment of the interface device 100 of the present invention, as represented in FIG. 3, installed as an interface between a vehicle electrical circuit and a monitor at a terminal block. In FIG. 4, the monitor terminal block is represented by the dark central portion while the electrical circuit terminal block is represented by the lighter peripheral portion. Several interface devices 100 of the present invention are shown interconnecting electrical circuits and corresponding monitors.

An electrical conditioning monitoring module for a vehicular electrical system and an exemplary vehicular electrical system suitable for incorporation of the monitoring module have been described herein. These and other variations, which will be appreciated by those skilled in the art, are within the intended scope of this invention as claimed below. As previously stated, detailed embodiments of the present invention are disclosed herein; however, it is to be understood that the disclosed embodiments are merely exemplary of the invention that may be embodied in various forms.

INDUSTRIAL APPLICABILITY

The present invention finds applicability in the vehicular electrical arts, and more specifically in the automotive electrical arts.

What is claimed and desired to be secured by Letters Patent is as follows:

1. An interface device coupled between a supply side of an electrical circuit, a load side of the electrical circuit and at least one sensing input terminal of a monitor, the interface device comprising:

a common terminal adapted to be coupled to a supply side terminal of the electrical circuit;

at least one sensing terminal adapted to be coupled to a corresponding monitor sensing input terminal;

at least one load terminal adapted to be coupled to a corresponding load side branch terminal of the electrical circuit, each load terminal being substantially at the same electrical point as a corresponding sensing terminal; and at least one sensing impedance coupled between the common terminal and a corresponding load terminal, each sensing impedance having an impedance substantially less than the aggregate load side impedance between said sensing impedance and ground when said interface device is coupled in series between the supply side and load side of the electrical circuit wherein the conductive elements of the interface device form a continuous resistance calibrated conductor and a non-conductive case substantially encloses the conductive elements, with the common terminal, each load terminal and each sensing terminal being exposed thereby allowing electrical communication between the common terminal, each load terminal and each sensing terminal and the corresponding terminals of the electrical circuit and the corresponding terminals of the monitor; and wherein the common terminal, each sensing terminal and each load terminal are formed into substantially flat tabs and are adapted for concurrent releasable mechanical engagement in electrical communication with the corresponding terminals of the electrical circuit and the corresponding terminals of the monitor.

2. An interface device coupled between a supply side of an electrical circuit, a load side of the electrical circuit and at least one sensing input terminal of a monitor, the interface device comprising:

a common terminal adapted to be coupled to a supply side terminal of the electrical circuit;

at least one sensing terminal adapted to be coupled to a corresponding monitor sensing input terminal;

at least one load terminal adapted to be coupled to a corresponding load side branch terminal of the electrical circuit, each load terminal being substantially at the same electrical point as a corresponding sensing terminal;

at least one sensing impedance coupled between the common terminal and a corresponding load terminal, each sensing impedance having an impedance substantially less than the aggregate load side impedance between said sensing impedance and ground when said interface device is coupled in series between the supply side and load side of the electrical circuit; and at least one supply side electrical circuit protective element in series between the common terminal and the aggregate sensing impedance of the interface device.

3. An interface device coupled between a supply side of an electrical circuit, a load side of the electrical circuit and at least one sensing input terminal of a monitor, the interface device comprising:

a common terminal adapted to be coupled to a supply side terminal of the electrical circuit;

at least one sensing terminal adapted to be coupled to a corresponding monitor sensing input terminal;

at least one load terminal adapted to be coupled to a corresponding load side branch terminal of the electrical circuit, each load terminal being substantially at the same electrical point as a corresponding sensing terminal;

at least one sensing impedance coupled between the common terminal and a corresponding load terminal, each sensing impedance having an impedance substantially less than the aggregate load side impedance between said sensing impedance and ground when said interface device is coupled in series between the supply side and load side of the electrical circuit; and at least one load side electrical circuit protective element in series between one of the sensing impedances and the corresponding load terminal.

4. An interface device coupled between a supply side of an electrical circuit, a load side of the electrical circuit and at least one sensing input terminal of a monitor, the interface device comprising:

a common terminal adapted to be coupled to a supply side terminal of the electrical circuit;

at least one sensing terminal adapted to be coupled to a corresponding monitor sensing input terminal;

at least one load terminal adapted to be coupled to a corresponding load side branch terminal of the electrical circuit, each load terminal being substantially at the same electrical point as a corresponding sensing terminal;

at least one sensing impedance coupled between the common terminal and a corresponding load terminal, each sensing impedance having an impedance substantially less than the aggregate load side impedance between said sensing impedance and ground when said interface device is coupled in series between the supply side and load side of the electrical circuit; and at least one monitor circuit protective element in series between one of the sensing impedances and the corresponding sensing terminal.

\* \* \* \* \*